US012658939B2

(12) United States Patent
Xu

(10) Patent No.: US 12,658,939 B2
(45) Date of Patent: Jun. 16, 2026

(54) DATA COMPRESSION METHOD AND APPARATUS, AND DATA DECOMPRESSION METHOD AND APPARATUS

(71) Applicant: CALTERAH SEMICONDUCTOR TECHNOLOGY (SHANGHAI) CO., LTD., Shanghai (CN)

(72) Inventor: Qi Xu, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 133 days.

(21) Appl. No.: 18/399,455

(22) Filed: Dec. 28, 2023

(65) Prior Publication Data

US 2024/0137043 A1     Apr. 25, 2024

Related U.S. Application Data

(63) Continuation of application No. PCT/CN2022/140807, filed on Dec. 21, 2022.

(30) Foreign Application Priority Data

Jun. 23, 2022     (CN) .......................... 202210720880.4

(51) Int. Cl.
*H03M 7/34*        (2006.01)
*G06F 3/06*        (2006.01)
*H03M 7/40*        (2006.01)

(52) U.S. Cl.
CPC ............ *H03M 7/40* (2013.01); *G06F 3/0608* (2013.01); *G06F 3/064* (2013.01); *G06F 3/0673* (2013.01)

(58) Field of Classification Search
CPC ........ H03M 7/40; H03M 7/24; H03M 7/6023; H03M 7/3059; H03M 7/30; G06F 3/0608; G06F 3/064; G06F 3/0673; G06F 17/147
(Continued)

(56) References Cited

U.S. PATENT DOCUMENTS 5,365,552 A * 11/1994 Astle ................ H04N 21/43072
                                                      375/E7.278
11,463,102 B2 * 10/2022 Lu ........................... H03M 7/30
(Continued)

FOREIGN PATENT DOCUMENTS

CN        107864379        3/2018
CN        112134568        12/2020
(Continued)

OTHER PUBLICATIONS

International Search Report issued for PCT/CN2022/140807, issued Mar. 1, 2023, 4 pages.
(Continued)

*Primary Examiner* — Jean B Jeanglaude
(74) *Attorney, Agent, or Firm* — Foley & Lardner LLP

(57)        ABSTRACT

A data compression method, apparatus, a data decompression method and apparatus are provided. In the methods an apparatuses, on the basis of an average effective bit value of data in a data block and an average storage bit width occupied by e remaining part of each item of data in the compressed data block, compression of a fixed compression rate is implemented on the remaining part of the data, reducing the storage space occupied by the remaining part of the data whilst allowing for quick restoration of the compressed data into the original data.

20 Claims, 4 Drawing Sheets

(58) Field of Classification Search
USPC ...................................................... 341/50, 51
See application file for complete search history.

(56)                References Cited

U.S. PATENT DOCUMENTS

| 2003/0140078 | A1 |    | 7/2003  | Feuser |  |
|---|---|---|---|---|---|
| 2014/0089208 | A1 |    | 3/2014  | Humble et al. |  |
| 2015/0348231 | A1 | * | 12/2015 | Jo | H03M 7/30 |
|  |  |  |  |  | 382/298 |
| 2019/0034334 | A1 | * | 1/2019  | Arelakis | H03M 7/40 |
| 2021/0152183 | A1 | * | 5/2021  | Lu | H03M 7/6023 |
| 2021/0201134 | A1 |    | 7/2021  | Li et al. |  |

FOREIGN PATENT DOCUMENTS

| CN |   | 112365247 |   | 2/2021 |  |  |
|---|---|---|---|---|---|---|
| CN |   | 113012635 |   | 6/2021 |  |  |
| JP | WO2016132430 | * | 8/2016 |  |  | H03M 7/30 |

OTHER PUBLICATIONS

Cho Sungyoon, et al., "A Low Complexity Baseband Signal Compression for Data Transport in LTE-A and NR Systems," 2020 IEEE 91st Vehicular Technology Conference (VTC2020-Spring), IEEE, May 25, 2020, pp. 1-5.

Elam David, et al., "A Block Floating Point Implementation for an N-Point FFT on the TMS320C55x DSP", Sep. 1, 2003, pp. 1-13, retrieved from the Internet:URL:https://www.ti.com/lit/an/spra948/spra948.pdf.

EP Search Report for EP Application No. EP22863691.6, dated Nov. 6, 2024.

Zhang Sai Qian, et al., "FAST: DNN Training Under Variable Precision Block Floating Point with Stochastic Rounding," Oct. 28, 2021, pp. 1-13, retrieved from the Internet: URL:https://arxiv.org/pdf/2110.15456v1.

EP Search Report for EP Application No. 25217840.5, dated Feb. 12, 2026.

* cited by examiner

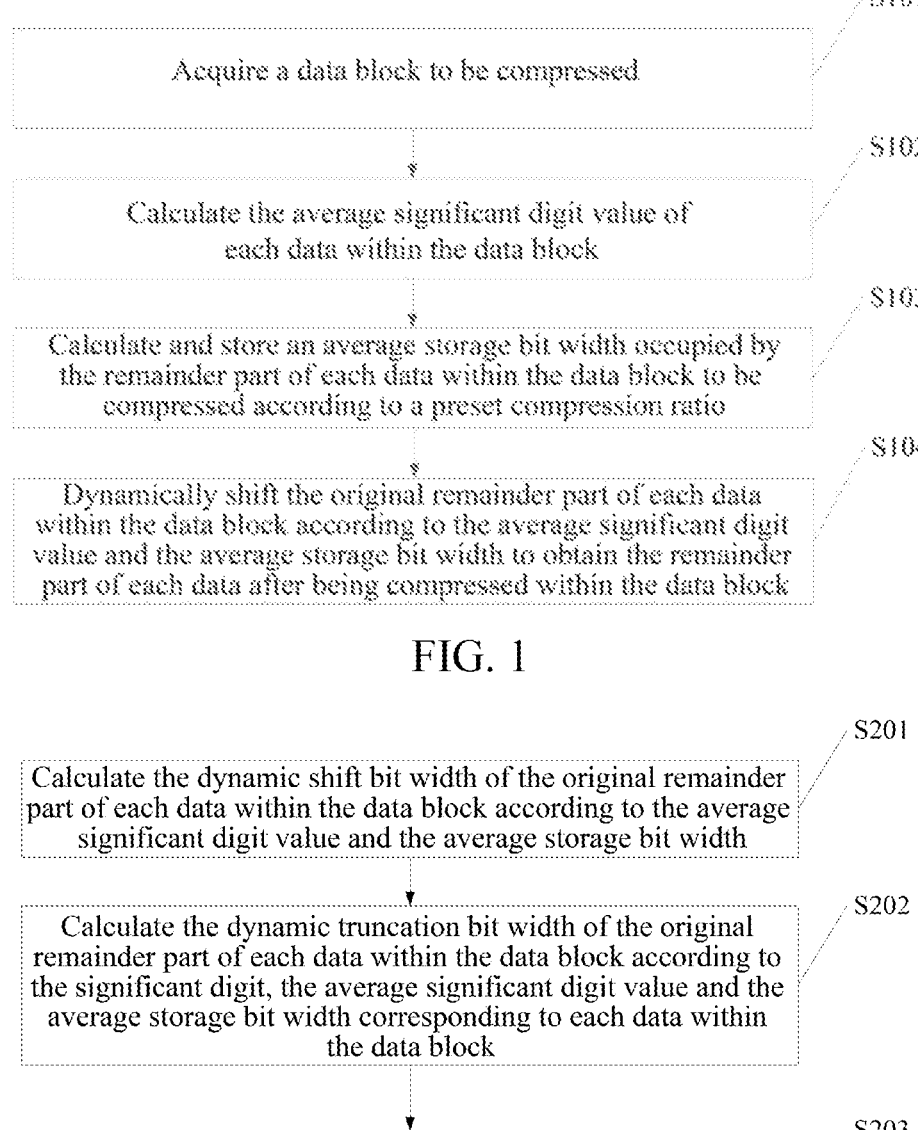

S101

Acquire a data block to be compressed

S102

Calculate the average significant digit value of
each data within the data block

S103

Calculate and store an average storage bit width occupied by
the remainder part of each data within the data block to be
compressed according to a preset compression ratio

S104

Dynamically shift the original remainder part of each data
within the data block according to the average significant digit
value and the average storage bit width to obtain the remainder
part of each data after being compressed within the data block

Calculate the dynamic shift bit width of the original remainder
part of each data within the data block according to the average
significant digit value and the average storage bit width

S202

Calculate the dynamic truncation bit width of the original
remainder part of each data within the data block according to
the significant digit, the average significant digit value and the
average storage bit width corresponding to each data within
the data block

S203

Shift the original remainder part of each data within the data
block by the corresponding dynamic shift bit width, and take the
corresponding dynamic truncation bit width for the highest bits
to obtain the remainder part of each data after being
compressed within the data block

FIG. 2

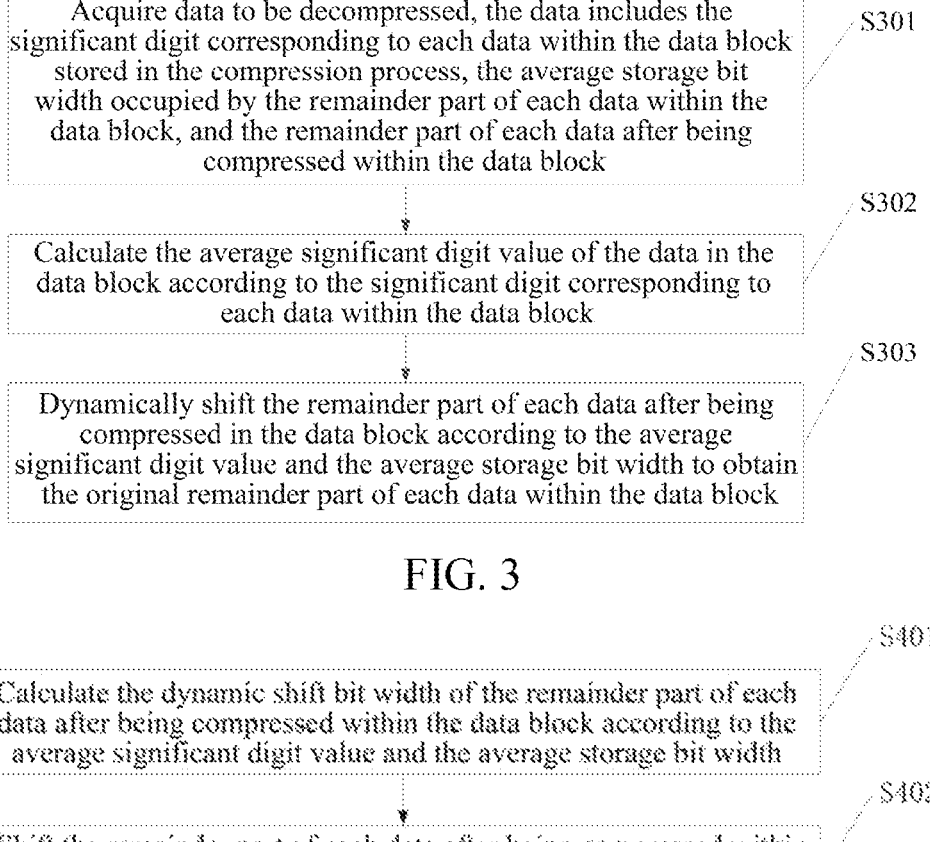

Acquire data to be decompressed, the data includes the significant digit corresponding to each data within the data block stored in the compression process, the average storage bit width occupied by the remainder part of each data within the data block, and the remainder part of each data after being compressed within the data block — S301

Calculate the average significant digit value of the data in the data block according to the significant digit corresponding to each data within the data block — S302

Dynamically shift the remainder part of each data after being compressed in the data block according to the average significant digit value and the average storage bit width to obtain the original remainder part of each data within the data block — S303

FIG. 3

Calculate the dynamic shift bit width of the remainder part of each data after being compressed within the data block according to the average significant digit value and the average storage bit width — S401

Shift the remainder part of each data after being compressed within the data block by the corresponding dynamic shift bit width to obtain the original remainder part of each data within the data block — S402

FIG. 4

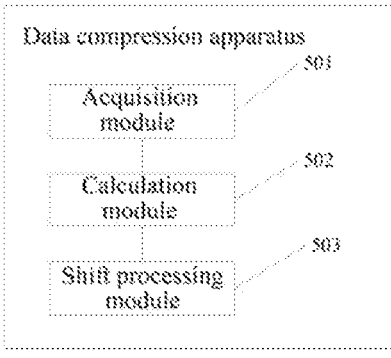

Data compression apparatus

Acquisition module — 501

Calculation module — 502

Shift processing module — 503

FIG. 5

DATA COMPRESSION METHOD AND APPARATUS, AND DATA DECOMPRESSION METHOD AND APPARATUS

CROSS-REFERENCE TO RELATED APPLICATION(S)

This application is a continuation of International PCT Application No. PCT/CN2022/140807 filed Dec. 21, 2022, which claims the priority to Chinese Patent Application No. 202210720880.4 filed on Jun. 23, 2022, the above identified applications are hereby incorporated herein by reference in their entireties.

TECHNICAL FIELD

The disclosure relates to the field of data storage technologies, in particular to a method and an apparatus for data compression and decompression.

BACKGROUND

In order to reduce the storage space and improve the efficiency of transmission, storage and processing, the data will be compressed according to certain algorithms in the process of data storage, where the data compression includes lossy compression and lossless compression.

Among related technologies, lossy compression mainly includes transform domain compression and predictive compression. Taking transform domain compression as an example, the transform compression involved is usually Discrete Cosine Transform (DCT) compression. Transform domain compression means that the data to be compressed is compressed by DCT operation, and the storage space is allocated according to the storage bit width occupied by the remainder part of the compressed data.

However, in lossy compression in related technologies, the compressed data occupies a large storage space.

SUMMARY

The disclosure provides a method and apparatus for data compression and decompression, which can reduce the storage space occupied by the compressed data.

In a first aspect, the present disclosure provides a data compression method including:

Acquiring a data block to be compressed;

Calculating the average significant digit value of each data within the data block;

Calculating and storing an average storage bit width occupied by the remainder part of each data within the data block to be compressed according to a preset compression ratio;

Dynamically shifting the original remainder part of each data within the data block according to the average significant digit value and the average storage bit width to obtain the remainder part of each data after being compressed within the data block.

In an embodiment, acquiring the data block to be compressed including:

Acquiring data to be compressed;

Chunking the data to be compressed to acquire a plurality of data blocks to be compressed;

For any data block to be compressed, determining and storing the significant digit corresponding to each data within the data block to be compressed.

In an embodiment, dynamically shifting the original remainder part of each data within the data block including:

Performing parallel processing on each data block obtained by the chunking, so as to dynamically shift the original remainder part of each data in each data block In an embodiment, the dynamically shifting the original remainder part of each data within the data block according to the average significant digit value and the average storage bit width to obtain the remainder part of each data after being compressed within the data block including:

Calculating the dynamic shift bit width of the original remainder part of each data within the data block according to the average significant digit value and the average storage bit width;

Calculating the dynamic truncation bit width of the original remainder part of each data within the data block according to the significant digit, the average significant digit value and the average storage bit width corresponding to each data within the data block;

Shifting the original remainder part of each data within the data block by the corresponding dynamic shift bit width, and taking the corresponding dynamic truncation bit width for the highest bit to obtain the remainder part of each data after being compressed within the data block.

In an embodiment, the shifting the original remainder part of each data within the data block by the corresponding dynamic shift bit width, and taking the corresponding dynamic truncation bit width for the highest bit to obtain the remainder part of each data after being compressed within the data block including:

Obtaining the remainder part of each data after being compressed within the data block using the following formula:

$$M_n[i]=\text{sat\_shift}(D[i],\text{avg\_}E-db,dt+E[i]-\text{avg\_}E+1)$$

Wherein, $M_n[i]$ is the remainder part of the i-th data after being compressed in the data block; $D[i]$ is the original remainder part of the i-th data in the data block; $\text{avg\_}E-db$ is the dynamic shift bit width of the original remainder part of the i-th data within the data block; $\text{avg\_}E$ is the average significant digit value; $db$ is the average storage bit width; $db+E[i]-\text{avg\_}E+1$ is the dynamic truncation bit width of the original remainder part of each data within the data block; $E[i]$ is the significant digit corresponding to the i-th data in the data block; sat shift can be used to represent the aforementioned shift operation, and the corresponding parameters can be the three values configured in parentheses, namely $D[i]$, $\text{avg\_}E-db$, $db+E[i]-\text{avg\_}E+1$.

In an embodiment, the calculated dynamic shift bit width is less than 0, and the original remainder part of each data within the data block shifts by the dynamic shift bit width to the left;

Alternatively, the calculated dynamic shift bit width is greater than 0, and the original remainder part of each data within the data block shifts by the dynamic shift bit width to the right.

In an embodiment, the calculating and storing an average storage bit width occupied by the remainder part of each data within the data block to be compressed according to a preset compression ratio including:

Acquiring the storage bit width occupied by each data when uncompressed in the data block and the storage bit width occupied by the significant digit part of each data in the data block;

Multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

In an embodiment, the determining and storing the significant digit corresponding to each data within the data block to be compressed including:

Each data within the data block is a real number, and the significant digit of each data within the data block determined and stored is the significant digit corresponding to the real number;

Alternatively, each data within the data block is a complex number, and the significant digit of each data within the data block determined and stored is the largest of the significant digits of both the real part and the imaginary part of the complex number.

In a second aspect, the present disclosure provides a data decompression method including:

Acquiring data to be decompressed, the data includes the significant digit corresponding to each data within the data block stored in the compression process, the average storage bit width occupied by the remainder part of each data within the data block, and the remainder part of each data after being compressed within the data block;

Calculating the average significant digit value of the data in the data block according to the significant digit corresponding to each data within the data block;

Dynamically shifting the remainder part of each data after being compressed in the data block according to the average significant digit value and the average storage bit width to obtain the original remainder part of each data within the data block.

In an embodiment, dynamically shifting the remainder part of each data after being compressed in the data block according to the average significant digit value and the average storage bit width to obtain the original remainder part of each data within the data block including:

Calculating the dynamic shift bit width of the remainder part of each data after being compressed within the data block according to the average significant digit value and the average storage bit width;

Shifting the remainder part of each data after being compressed within the data block by the corresponding dynamic shift bit width to obtain the original remainder part of each data within the data block.

In an embodiment, shifting the remainder part of each data after being compressed within the data block by the corresponding dynamic shift bit width to obtain the original remainder part of each data within the data block including:

Obtaining the original remainder part of each data within the data block using the following formula:

$$D_{[i]}'=\text{shift}(M_n[i], db-\text{avg\_}E)$$

Wherein, $D_{[i]}'$ is the original remainder part of the i-th data in the data block;

$M_n[i]$ is the remainder part of the i-th data after being compressed in the data block; $db-\text{avg\_}E$ is the dynamic shift bit width of the remainder part of the i-th data after being compressed in the data block, and $\text{avg\_}E$ is the average significant digit value; db is the average storage bit width.

In an embodiment, the calculated dynamic shift bit width is less than 0, and the remainder part of each data after being compressed in the data block shifts by the dynamic shift bit width to the left;

Alternatively, the calculated dynamic shift bit width is greater than 0, and the remainder part of each data after being compressed within the data block shifts by the dynamic shift bit width to the right.

In an embodiment, the data to be decompressed further includes the storage bit width occupied by each data when uncompressed in the data block stored in the compression process and the storage bit width occupied by the significant digit part of each data in the data block;

The average storage bit width occupied by the remainder part of each data within the data block is calculated according to a preset compression ratio, and including:

Multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

In an embodiment, the significant digit corresponding to each data within the data block include:

Each data within the data block is a real number, and the significant digit of each data within the data block is the significant digit corresponding to the real number;

Alternatively, each data within the data block is a complex number, and the significant digit of each data within the data block is the largest of the significant digits of both the real part and the imaginary part of the complex number.

In a third aspect, the present disclosure provides a method of data compression and storage, which can be applied to any data block to be compressed, the data block including at least two data to be compressed, the method including:

For any of the data to be compressed, compressing and storing the data to be compressed as compressed data of a data combination;

Wherein the data combination includes a significant digit unit and a remainder unit.

In an embodiment, the method further includes:

Acquiring the significant digit part of the data to be compressed;

Wherein, the significant digit part is retained and stored in the significant digit unit in a variable length format.

In an embodiment, the method further includes:

Acquiring the remainder part of the data to be compressed using the data compression method as described in any one of the present disclosure;

Wherein the remainder part is stored in the remainder unit.

In a fourth aspect, the present disclosure provides a method of data decompression, applied to the compressed data of a data combination obtained using the method as described in any one of the present disclosure, the method including:

Restoring the corresponding significant digit part from the compressed data and obtaining the significant digit of the compressed data;

Obtaining the remainder part of the compressed data using the data decompression method according to any one of the disclosure based on the significant digit; and Obtaining the decompressed data corresponding to the compressed data based on the significant digit part and the remainder part.

In a fifth aspect, the present disclosure provides a data compression apparatus including:

An acquisition module for acquiring a data block to be compressed;

A calculation module for calculating the average significant digit value of each data within the data block; calculating and storing an average storage bit width occupied by the remainder part of each data within the data block to be compressed according to a preset compression ratio;

A dynamic shift processing module for dynamically shifting the original remainder part of each data within the data block according to the average significant digit value and the average storage bit width to obtain the remainder part of each data after being compressed within the data block.

In a sixth aspect, the present disclosure provides a data decompression apparatus including:

An acquisition module for acquiring data to be decompressed, the data includes the significant digit corresponding to each data within the data block stored in the compression process, the average storage bit width occupied by the remainder part of each data within the data block, and the remainder part of each data after being compressed within the data block;

A calculation module for calculating the average significant digit value of the data in the data block according to the significant digit corresponding to each data within the data block;

A dynamic shift processing module for dynamically shifting the remainder part of each data after being compressed in the data block according to the average significant digit value and the average storage bit width to obtain the original remainder part of each data within the data block.

In a seventh aspect, the present disclosure provides a data compression device including: at least one processor, a memory, a receiver, and a transmitter;

The receiver and the transmitter are both coupled to the processor; the processor controls the receiving action of the receiver, and the processor controls the transmitting action of the transmitter;

The memory stores computer-executed instructions;

The at least one processor executes the computer-executed instructions stored in the memory such that the data compression device performs the method of any one of the first aspect.

In an eighth aspect, the present disclosure provides a data decompression device, including: at least one processor, a memory, a receiver, and a transmitter;

The receiver and the transmitter are both coupled to the processor; the processor controls the receiving action of the receiver, and the processor controls the transmitting action of the transmitter;

The memory stores computer-executed instructions;

The at least one processor executes the computer-executed instructions stored in the memory such that the data decompression device performs the method of any of the second aspect.

In a ninth aspect, the present disclosure provides a computer-readable storage medium having computer-executed instructions stored thereon that, when executed by a processor, implement the method of any one of the first, second, third and fourth aspects.

In a tenth aspect, the present disclosure provides a computer program product including a computer program that, when executed by a processor, implements the method of any one of the first, second, third and fourth aspects.

The method and apparatus for data compression and decompression provided by the embodiment of the disclosure acquires a data block to be compressed, calculates the average significant digit value of each data within the data block, then calculates and stores an average storage bit width occupied by the remainder part of each data within the data block to be compressed according to a preset compression ratio, and finally, dynamically shifts the original remainder part of each data within the data block according to the average significant digit value and the average storage bit width to obtain the remainder part of each data after being compressed within the data block. According to the method of the present invention, according to the average significant digit value and the average storage bit width of the data within the data block, the remainder part of the data is compressed, thereby reducing the storage space occupied by the remainder part of the data.

BRIEF DESCRIPTION OF THE DRAWINGS

The accompanying drawings herein are incorporated into and constitute a part of the specification, illustrate embodiments consistent with the present disclosure and together with the description serve to explain the principles of the disclosure.

FIG. 1 is a schematic diagram of a flow of a data compression method provided by embodiment 1 of the present disclosure;

FIG. 2 is a schematic diagram of a flow of another data compression method provided by embodiment 2 of the present disclosure;

FIG. 3 is a schematic diagram of a flow of a data decompression method provided by embodiment 4 of the present disclosure;

FIG. 4 is a schematic diagram of a flow of another data decompression method provided by embodiment 5 of the present disclosure;

FIG. 5 is a schematic diagram of a structure of a data compression apparatus provided by embodiment 7 of the present disclosure;

Figure 6:
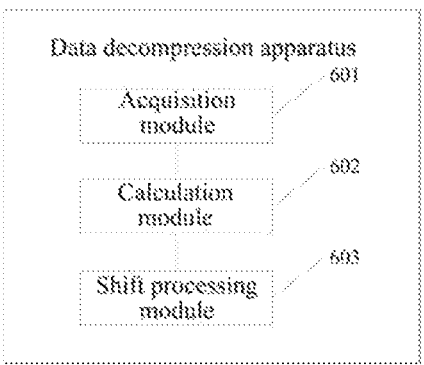
FIG. 6 is a schematic diagram of a structure of a data decompression apparatus provided by embodiment 8 of the present disclosure.

Specific embodiments of the present disclosure have been shown by the above drawings and will be described in more detail below. These drawings and textual description are not intended in any way to limit the scope of the conception of the disclosure, but rather to illustrate the concepts of the disclosure for those skilled in the an by reference to particular embodiments.

DETAILED DESCRIPTION

Exemplary embodiments, examples of which are shown in the drawings, will be explained in detail here. When the following description relates to the drawings, the same numerals in different drawings denote the same or similar elements unless otherwise indicated. The implementation modes described in the following exemplary embodiments are not representative of all implementation modes consistent with the present disclosure. Rather, they are only examples of apparatuses and methods consistent with some aspects of the present disclosure as detailed in the appended claims.

It should be noted that, in the description of embodiments of the present disclosure, terms indicating direction or positional relationships, such as "inside", "outside", "left", "right" are based on the direction or positional relationship shown in the drawings, and are merely for facilitating the description, rather than indicating or implying that a referred apparatus or member must have a particular orientation, be constructed and operated in the particular orientation. Therefore, they cannot be understood as limitations on the present disclosure.

When data is compressed and stored, it is usually stored in binary scientific notation based on IEEE 754 standard, which is known as Institute of Electrical and Electronics Engineers (IEEE) Binary Floating Point Arithmetic Standard, also known as Binary Floating Point Arithmetic for a microprocessor system. The IEEE 754 standard stores data in such a format that, for example, decimal number 8.25 can be converted to binary number $1.00001*2^3$, where "1.00001" indicates the remainder part of the data and "3" indicates the exponential part of the data, also known as the significant digit.

The data is converted into binary scientific notation for storage, and the integer of the remainder part is all 1, which need not be reflected in memory, only the binary "00001" after the decimal point needs to be stored in memory. As for its storage format, exemplarily, Table 1 shows the storage format of 32 bit data, as shown in Table 1, when storing data, the highest bit, i.e., the leftmost bit, is the sign bit, which is used to indicate the positive and negative data, the middle part is the exponent bit, which is used to store the exponent part, i.e., the significant digit part, and the right part is the remainder part, which is used to store the remainder.

TABLE 1

| 0 | 11 | 00001 |
|---|----|-------|

First of all, the data needs to be compressed before being stored. In this disclosure, it mainly refers to the compression of the remainder part of the data.

Data compression is to reduce the storage space by reducing the amount of data without losing useful information, so as to improve its transmission, storage and processing efficiency. When data is compressed, the data is usually reorganized according to a certain algorithm, and the storage space is saved by reducing the redundancy of data. Data compression includes lossy compression and lossless compression.

The data compression method provided by the embodiment of the disclosure is lossy compression of data. Among them, lossy compression means that some information is allowed to be lost in data compression. Although the original data cannot be completely recovered, the lost part has little influence on the original data.

Because the lossy compression in related technology determines the compression ratio of compression according to the compression algorithm used and the type of data, that is to say, the compression algorithm in related technology cannot achieve the compression for all types of data in a fixed compression ratio, but can only compress some data with uniform probability distribution. However, for certain data with non-uniform probability distribution, even after compressing the original data, the compressed data still occupies a relatively large amount of storage space due to the smaller compression ratio.

Therefore, to address the above technical problems of the prior art, the embodiment of the disclosure provides a method and apparatus for data compression and decompression, which involve acquiring a data block to be compressed, calculating the average significant digit value of each data within the data block for any data block, and then calculating and storing the average storage bit width occupied by the remainder part of each data within the data block to be compressed according to a preset fixed compression ratio (preset compression ratio), and finally, dynamically shifting the original remainder part of each data within the data block according to the average significant digit value and the average storage bit width to obtain the remainder part of each compressed data within the data block. Thereby, the remainder part of the data is compressed with a fixed compression ratio through the average significant digit value and the average storage bit width, so as to reduce the storage space occupied by the remainder part of the data. At the same time, when performing operations such as compression, storage, decompression, etc., because the data is independent of each other, the compression and/or decompression operations can be independently performed among each data block, thereby achieving parallel data processing without affecting each other. That is to say, embodiments of the present disclosure can solve problems such as data compression and storage at large data volumes with wide dynamic ranges, and achieve significant data compression and storage with minimal performance loss. Additionally, it can achieve compression with relatively fixed compression ratio and/or non-fixed compression ratio regardless of data probability distribution.

Embodiments of the present disclosure can be applied to compression and decompression of various types of data, such as data types that can be data with uniform probability distribution or data with non-uniform probability distribution, and these data can be voice, image or video data, such as range dimension data, velocity dimension data and/or angle dimension data obtained after data processing based on Frequency Modulated Continuous Wave (FMCW) radar. It is to be understood that the data compression and decompression methods provided by the embodiments of the present disclosure include, but are not limited to, the above data types, and are not therefore taken as a limitation to the present disclosure.

The technical solutions of the present disclosure and how the technical solutions of the present disclosure solve the above technical problems are described in detail with specific embodiments. The following specific embodiments may be combined with one another, and identical or similar concepts or processes may not be repeated in some embodiments. Embodiments of the present disclosure will be described below in conjunction with the accompanying drawings.

FIG. 1 is a schematic diagram of a flow of a data compression method provided by embodiment 1 of the present disclosure. As shown in FIG. 1, the method may include the following acts.

In act S101, acquiring a data block to be compressed.

The executive body of the present disclosure may be a computer or other apparatus or device capable of compressing data. The present embodiment is described by taking the computer as an example.

When the computer processes data, whether the input data is decimal of hexadecimal, it is finally converted into binary scientific notation for storage.

Among them, the data block is obtained by chunking the data to be compressed so as to obtain multiple data blocks. The number of data in each data block can be set individually according to the compression requirements, for example, in chunks of every 2 data, every 3 data or every 4 data, etc. The specific number is not limited in the embodiment of the present disclosure.

In act S102, calculating the average significant digit value of each data within the data block.

After the data to be compressed is chunked, the significant digit corresponding to each data within the data block to be compressed is determined and stored.

This disclosure takes four data contained in a data block as an example, determines the significant digit E[i] corresponding to the four data in the data block, and stores the significant digit in the storage unit of the computer. Where i indicates the i-th data in the data block.

In an exemplary example, the determination of the significant digit corresponding to each data in a data block may include following operations.

For the case that each data within the data block is a real number, the significant digit of each data within the data block determined and stored is the significant digit corresponding to the real number.

In an exemplary example, the determination of the significant digit corresponding to each data in a data block may include following operations.

For the case that each data within the data block is a complex number, the significant digit of each data within the data block determined and stored is the largest of the significant digit of both the real part and the imaginary part of the complex number.

After determining the significant digit of each data within the data block, the average significant digit value is calculated. In the embodiment of the present disclosure, the method for calculating the average significant digit value is not limited, and any averaging algorithm or formula can be used to calculate the average value of the significant digit in each data block.

Exemplarily, the average value of the significant digit in the data block may be calculated by the following algorithm.

$$avg\_E = average(E[0] + E[1] + \ldots + E[blk_{sz} - 1])$$

Wherein, $E[blk_{sz} - 1]$ is the significant digit of the ($blk_{sz} - 1$)-th data in the data block; average is an operation that calculates the mean value.

In an embodiment, it is assumed that the data block contains four data with significant digits of 17, 16, 15 and 16, respectively. According to the above algorithm, the calculated average significant digit value is 16.

It can be understood that after the averaging algorithm, it may occur that the average significant digit value obtained is not an integer but a decimal. At this time, in order to obtain an integer, embodiments of the present disclosure may include, but are not limited to, such as: rounding the decimal up; or, rounding the decimal down; or rounding the decimal using the rounding-to-nearest method. For example, suppose the average significant digit value calculated is 17.49, then it is rounded up to 18, or rounded down to 17, or rounded using the rounding-to-nearest method to 17.

In act S103, calculating and storing an average storage bit width occupied by the remainder part of each data within the data block to be compressed according to a preset compression ratio.

The preset compression ratio can be flexibly set according to the requirements. By compressing the data to reach the preset compression ratio, the data can be compressed with a fixed compression ratio.

The average storage bit width db can be expressed as the average storage bit width occupied by the remainder part of each data after compression and storage within the data block, which is determined by the preset compression ratio and the proportion of the significant digit of each data within the data block.

In an exemplary example, calculating the average storage bit width db occupied by the remainder part of each compressed data within the data block in act S103 may include following operations.

Acquiring the storage bit width occupied by each data when uncompressed in the data block and the storage bit width occupied by the significant digit part of each data in the data block;

Multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

It should be noted that the acquired storage bit width occupied by each data when uncompressed in the data block and the storage bit width occupied by the significant digit part of each data in the data block are related to the storage format of the data in the computer. Therefore, the storage bit width obtained for the same data may be different due to different storage format. The specific storage format and the determination of the corresponding storage bit width can refer to the related technology, and the specific implementation is not intended to limit the scope of protection of the present disclosure, and will not be described in detail here.

In an embodiment, assuming that the preset compression ratio is 0.5, the storage bit width occupied by some data when uncompressed in the data block is 16 bits, and the storage bit width occupied by the significant digit part of the data in the data block is 2 bits. Then the average storage bit width occupied by the remainder part of the data within the data block is db=16×0, 5−2=6 bits.

In act S104, dynamically shifting the original remainder part of each data within the data block according to the average significant digit value and the average storage bit width to obtain the remainder part of each data after being compressed within the data block.

In the embodiment of the present disclosure, the compression of data mainly refers to the compression of the remainder part of the data.

In an exemplary example, act S104 may include following operations.

Calculating the dynamic shift bit width and the dynamic truncation bit width of the original remainder part of each data within the data block according to the average significant digit value and the average storage bit width;

Dynamically shifting the original remainder part of each data within the data block, according to the dynamic shift bit width and the dynamic truncation bit width, to obtain the remainder part of each data after being compressed within the data block.

It should be specifically noted that in the compression process, each data block obtained by the chunking can be compressed in parallel, that is, the original remainder part of various data within each data block can be dynamically shifted at the same time, thereby improving the compression efficiency of the data.

The specific method for obtaining the remainder part of each data after being compressed within the data block will be described in detail in embodiment 2 of the present disclosure, and please refer to embodiment 2.

In the above embodiment of the present disclosure, by acquiring a data block to be compressed, calculating the average significant digit value of each data within the data block, then calculating and storing an average storage bit width occupied by the remainder part of each data within the data block to be compressed according to a preset compression ratio, and finally, dynamically shifting the original remainder part of each data within the data block according to the average significant digit value and the average storage bit width, the remainder part of each data after being compressed within the data block is obtained. According to the average significant digit value of the data in the data block and an average storage bit width occupied by the remainder part of each compressed data within the data block, the method of the embodiment achieves the compression of the remainder part of the data with a fixed compression ratio, thereby reducing the storage space occupied by the remainder part of the data.

Optionally, on the basis of above embodiment 1, the detailed process of dynamically shifting the original remainder part of each data within the data block according to the average significant digit value and the average storage bit width to obtain the remainder part of each data after being compressed within the data block in the above act S104 will be described below in conjunction with the embodiment shown in FIG. 2.

FIG. 2 is a schematic diagram of a flow of another data compression method provided by embodiment 2 of the present disclosure. As shown in FIG. 2, the method includes the following acts.

In act S201, calculating the dynamic shift bit width of the original remainder part of each data within the data block according to the average significant digit value and the average storage bit width.

In act S202, calculating the dynamic truncation bit width of the original remainder part of each data within the data block according to the significant digit, the average significant digit value and the average storage bit width corresponding to each data within the data block.

In act S203, shifting the original remainder part of each data within the data block by the corresponding dynamic shift bit width, and taking the corresponding dynamic truncation bit width for the highest bits to obtain the remainder part of each data after being compressed within the data block.

In an embodiment, the remainder part of each data after being compressed within the data block may be obtained using the following formula.

$$M_n[i]\mathrm{sat\_shift}(D[i],\mathrm{avg\_}E-db,db+E[i]-\mathrm{avg\_}E+1)$$

Wherein, $M_n[i]$ is the remainder part of the i-th data after being compressed in the data block; $D[i]$ is the original remainder part "dat" of the i-th data in the data block; $\mathrm{avg\_}E-db$ is the dynamic shift bit width shift bit of the original remainder part of the i-th data in the data block; $\mathrm{avg\_}E$ is the average significant digit value; $db$ is the average storage bit width, $db+E[i]-\mathrm{avg\_}E+1$ is the dynamic truncation bit_width bit width of the original remainder part of each data within the data block; $E[i]$ is the significant digit corresponding to the i-th data in the data block.

Among them, $\mathrm{sat\_shift}(dat, shift\_bit, bit\_width)$ is to round the original remainder part of each data within the data block to the integer, shifts it by $shift\_bit$, and then the saturation operation is performed to take $bit\_width$ for the highest bits, that is, to retain $bit\_width$ bits.

It should be noted that when the above dynamic shift bit width calculated is less than 0, the original remainder part of each data within the data block is shifted by the calculated dynamic shift bit width to the left;

Alternatively, when the calculated dynamic shift bit width is greater than 0, the original remainder part of each data within the data block is shifted by the calculated dynamic shift bit width to the right.

In the embodiment shown in FIG. 2 of the present disclosure, the storage space occupied by the remainder portion of each data in the data block is determined by calculating the dynamic shift bit width of the original remainder part of each data within the data block according to the average significant digit value and the average storage bit width and calculating the dynamic truncation bit width of the original remainder part of each data within the data block according to the significant digit, the average significant digit value and the average storage bit width corresponding to each data within the data block. Then, the original remainder part of each data within the data block is shifted by the corresponding dynamic shift bit width, and the corresponding dynamic truncation bit width is taken for the highest bits, finally, the remainder part of each data after being compressed within the data block is obtained. And the compression of the remainder part of the data is completed and the storage space is reduced.

In an exemplary example, in order to facilitate understanding of the methods of embodiments 1 and 2, the data compression method will be described in detail exemplarily below by specific embodiment 3.

Firstly, the remainder part of the data and the significant digit for a positive number, a negative number and the real part and imaginary part of a complex number are defined.

The significant digit for both the positive number and the real part of the complex number refers to the length from the first non-0 bit starting from the highest bit to the lowest digit, where the highest digit indicates the sign digit, "0" indicates a positive number and "1" indicates a negative number.

As shown in Table 2, the number shown in Table 2 is a positive number or a real part of a complex number. According to the above definition, it can be seen that the significant digit of this number is 14, and the remainder part is "11010101110010".

TABLE 2

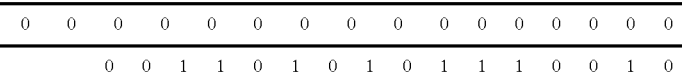

| 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|
|   |   | 0 | 0 | 1 | 1 | 0 | 1 | 0 | 1 | 0 | 1 | 1 | 1 | 0 | 0 | 1 | 0 |

The significant digit for both the negative number and the imaginary part of the complex number is the length from the first non-1 bit starting from the highest bit to the lowest bit.

As shown in Table 3, the number represented in Table 3 is a negative number or an imaginary part of a complex number. According to the above definition, it can be seen that the significant digit of the number is 15, and the remainder part is "000000000011000".

TABLE 3

| 1 | 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|---|
|   | 1 | 0 | 0 | 0 | 0 | 0 | 0 | 0 | 0 | 0 | 1 | 1 | 0 | 0 | 0 |

Assuming that the data to be compressed is shown in Table 4 below, where the data to be compressed is a hexadecimal complex number with a storage bit width of 32 bits. It should be noted that in Table 4, the number with bits not shown in full should be preceded by "0", for example, "a8f0" is actually "0000a8f0".

TABLE 4

| Serial number | Real part | Imaginary part |
|---|---|---|
| 0 | 0 × fffe6ad0 | 0 |
| 1 | 0 × a8f0 | 0 × 8160 |
| 2 | 0 × ffffb11c | 0 × 5e84 |
| 3 | 0 × 88 b0 | 0 × ffff8368 |

After converting Table 4 into binary, the corresponding binary data are shown in Table 5, respectively:

TABLE 5

| Real part | Imaginary part |
|---|---|
| 1111111111111100110101011010000 | 0 |
| 1010100011110000 | 1000000101100000 |
| 11111111111111101000100011100 | 0101111010000100 |
| 1000100010110000 | 1111111111111111000001101101000 |

Because the significant digit of a complex number is the larger one of the significant digit of both the real part and the imaginary part of the complex number, we can get that the significant digit of the data with serial number 0 is 17, the significant digit of the data with serial number 1 is 16, the significant digit of the data with serial number 2 is 15, and the significant digit of the data with serial number 3 is 16 according to the determination methods of Tables 2 and 3.

After the data to be compressed is chunked, the significant digit corresponding to each data within the data block are determined and stored, wherein, the corresponding significant digits are 17, 16, 15 and 16.

The average significant digit value of each data within the data block is calculated as follows:

$$\text{avg\_E} = \text{average } (E[0] + E[1] + E[2] + E[3]) = \frac{17 + 16 + 15 + 16}{4} = 16$$

Assuming that the calculated average storage bit width db occupied by the remainder part of each data within the data block is 5 bits, the remainder part of each data after being compressed within the data block can be obtained according to acts S201-S203 in embodiment 2.

Exemplarily, the compression process is illustrated as follows by taking the data with serial number 0 in Table 4 as an example.

As shown in act S201 in embodiment 2, according to the average significant digit value and the average storage bit width, the dynamic shift bit width of the original remainder part of each data within the data block is calculated as follows:

$$\text{avg\_E}-db=16-5=11$$

As shown in act S202 in embodiment 2, according to the significant digit, the average significant digit value and the average storage bit width corresponding to each data within the data block, the dynamic truncation bit width of the original remainder part of each data within the data block is calculated as follows:

$$db+E[i]-\text{avg\_E}+1=5+17-16+1=7$$

As shown in act S203 in embodiment 2, the original remainder part of each data within the data block is shifted by the corresponding dynamic shift bit width, and the corresponding dynamic truncation bit width is taken for the highest bits to obtain the remainder part of each data after compression within the data block.

Because the dynamic shift bit width of 11 is greater than 0, it is shifted by 11 bits to the right, and 7 bits is taken for the highest bits in saturation operation, that is, 7 bits are retained.

Specifically,

After rounding operation, the original remainder part of the data "1111111111111100110101011010000" is shifted to the right by 11 bits to become "11111111111111111001101", 7 bits are retained and it becomes "1001101". Therefore, the remainder part after data compression is "1001101", which is converted into hexadecimal to become "4d".

Accordingly, the remaining data in Table 4 are compressed as described in the above acts, which are not exemplified herein. After compression, the data in Table 4 are shown in Table 6.

TABLE 6

| Serial number | Real part | Imaginary part |
|---|---|---|
| 0 | 0 × 4d | 0 |
| 1 | 0 × 15 | 0 ×10 |
| 2 | 0 × 16 | 0 × c |
| 3 | 0 × 11 | 0 × 30 |

The present embodiment is a specific and exemplary illustration according to the acts shown in the above-mentioned embodiments 1 and 2, which achieve similar technical effects, and will not be repeated.

Next, a data decompression method will be described. FIG. 3 is a schematic diagram of a flow of a data decompression method provided by embodiment 4 of the present disclosure. As shown in FIG. 3, the data decompression method may include the following acts:

Act S301, acquiring data to be decompressed, the data includes the significant digit corresponding to each data within the data block stored in the compression process, the average storage bit width occupied by the remainder part of each data within the data block, and the remainder part of each data after being compressed within the data block.

The executive body of the present disclosure may be a computer or other apparatus or device capable of compressing data. The present embodiment is described by taking the computer as an example.

Act S302, calculating the average significant digit value of the data in the data block according to the significant digit corresponding to each data within the data block.

In the process of data compression, the data to be compressed is chunked, and the significant digit E[i] corresponding to each data within each data block is stored in advance in the storage unit of the computer, where i indicates the i-th data in the data block.

The determination of the significant digit corresponding to each data in a data block may include following operations.

For the case that each data within the data block is a real number, the significant digit of each data within the data block determined and stored is the significant digit corresponding to the real number;

For the case that each data within the data block is a complex number, the significant digit of each data within the data block determined and stored is the largest of the significant digit of both the real part and the imaginary part of the complex number.

After determining the significant digit of each data within the data block, the average significant digit value is calculated. In the embodiment of the present disclosure, the method for calculating the average significant digit value is not limited, and any averaging algorithm or formula can be used to calculate the average value of the significant digit in each data block. As in embodiment 1, this will not be repeated here.

Act S303, dynamically shifting the remainder part of each data after being compressed in the data block according to the average significant digit value and the average Storage bit width to obtain the original remainder part of each data within the data block.

In the process of data compression, the average storage bit width db occupied by the remainder part of each data within the data block has been stored in advance in the storage unit of the computer.

The average storage bit width db can be expressed as the average storage bit width occupied by the remainder part of each data after being compressed and stored within the data block, which is determined by the preset compression ratio and the proportion of the significant digit of the data within the data block.

In an exemplary example, the data to be decompressed further includes the storage bit width occupied by each data when uncompressed in the data block stored in the compression process and the storage bit width occupied by the significant digit part of each data in the data block, the average storage bit width db may be calculated according to the preset compression ratio, which, In an embodiment, includes following operations.

Acquiring the storage bit width occupied by each data when uncompressed in the data block and the storage bit width occupied by the significant digit part of each data in the data block;

Multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

The way in which the average storage bit width db is calculated corresponds to the way in which the data is compressed during the compression process, see embodiment 1 and will not be illustrated exemplarily here.

In an embodiment, the dynamic shift bit width of the remainder part of each data after being compressed within the data block can be calculated according to the average significant digit value and the average storage bit width, and the remainder part of each data after being compressed within the data block can be dynamically shifted according to the dynamic shift bit width to obtain the original remainder part of each data within the data block.

In particular, it should be noted that during the decompression process, the decompression of multiple data blocks can likewise be processed in parallel, thereby improving the decompression efficiency of the data.

The specific method for obtaining the original remainder part of each data within the data block will be described in detail in embodiment 5, and please refer to embodiment 5.

In the data decompression method embodiment of the disclosure, the original remainder part of each data within the data block is obtained by: acquiring data to be decompressed, wherein the acquired data to be decompressed includes the significant digit corresponding to each data within the data block stored in the compression process, the average storage bit width occupied by the remainder part of each data within the data block, and the remainder part of each data after being compressed within the data block, and calculating the average significant digit value of the data in the data block according to the significant digit corresponding to each data within the data block, and finally, dynamically shifting the remainder part of each data after being compressed in the data block according to the average significant digit value and the average storage bit width. According to the method of the embodiment, the compressed data can be quickly restored to the original data.

Optionally, on the basis of embodiment 4 above, the detailed process of dynamically shifting the remainder part of each data after being compressed in the data block according to the average significant digit value and the average storage bit width to obtain the original remainder part of each data within the data block in above act S303 is described below in conjunction with the embodiment shown in FIG. 4.

FIG. 4 is a schematic diagram of a flow of another data decompression method provided by embodiment 5 of the present disclosure. As shown in FIG. 4, the method includes the following acts.

Act S401, calculating the dynamic shift bit width of the remainder part of each data after being compressed within the data block according to the average significant digit value and the average storage bit width.

Act S402, shifting the remainder part of each data after being compressed within the data block by the corresponding dynamic shift bit width to obtain the original remainder part of each data within the data block.

Specifically, The original remainder part of each data within the data block is obtained using the following formula.

$$D_{[i]}' = \mathrm{shift}(M_n[i], db - \mathrm{avg\_}E)$$

Wherein, $D_{[i]}'$ is the original remainder part of the i-th data in the data block;

$M_n[i]$ is the remainder part "dat" of the i-th data after being compressed in the data block; $db-\mathrm{avg\_}E$ is the dynamic shift bit width "shift_bit" of the remainder part of the i-th data after being compressed in the data block, and avg_E is the average significant digit value; db is the average storage bit width.

Among them, sat_shift (dat, shift_bit) is to shift the remainder part of each data after being compressed in the data block by shift_bit and restore it to the original data.

It should be noted that, In the case that the calculated dynamic shift bit width above is less than 0, the remainder part of each data after being compressed in the data block is shifted by the calculated bit dynamic shift bit width to the left;

In the case that the calculated dynamic shift bit width above is greater than 0, the remainder part of each data after being compressed within the data block is shifted by the calculated dynamic shift bit width to the right.

In the embodiment shown in FIG. 4 of the present disclosure, by calculating the dynamic shift bit width of the remainder part of each data after being compressed within the data block according to the average significant digit value and the average storage bit width, and shifting the remainder part of each data after being compressed within the data block by the corresponding dynamic shift bit width, the original remainder part of each data within the data block is obtained, and a fast restoration of the compressed data to the original data is achieved.

In an exemplary example, in order to facilitate understanding the methods of embodiments 4 and 5, the data decompression method will be described in detail below by specific embodiment 6.

In the present embodiment, the way of calculating the average significant digit value of the data in the data block and the average storage bit width db occupied by the remainder part of each data within the data block is as described in embodiment 3 and will not be described here. Herein, the average significant digit value is 16, and the average storage bit width db is 5 bits.

According to the description in embodiment 5, the original remainder part of each data within the data block can be obtained.

Exemplarily, the decompression process is illustrated by taking the data with serial number 0 in Table 6 as an example.

As shown in act 401 in embodiment 5, according to the average significant digit value and the average storage bit width, the dynamic shift bit width of the remainder part of each data after being compressed within the data block is calculated as follows:

$$db\text{-}\mathrm{avg}_E=5\text{-}16=\text{-}11$$

As shown in act 402 of embodiment 5, the remainder part of each data after being compressed within the data block is shifted by the corresponding dynamic shift bit width to obtain the original remainder part of each data within the data block.

Because the dynamic shift bit width of −11 is less than 0, it is shifted to the left by 11 bits.

Specifically, The remainder part of the compressed data is "1001101", and is shifted to the left by 11 bits to become "100110100000000000". Because the storage bit width of the data before compression is 32 bits, and currently it is 18 bits, so the missing 14 bits are filled. Because the highest bit of "100110100000000000" after being shifted to the left by 11 bits is "1", the complement digit is "1". Therefore, the original remainder part of the decompressed data is "11111111111111100110100000000000", which is converted into hexadecimal and becomes "fffe6800".

Accordingly, the remaining data in Table 6 are decompressed according to the above acts, which are not exemplified herein. After decompression, the data in Table 6 are shown in Table 7.

TABLE 7

| Serial number | Real part | Imaginary part |
|---|---|---|
| 0 | 0 × fffe6800 | 0 |
| 1 | 0 × a800 | 0 × 8000 |
| 2 | 0 × ffffb000 | 0 × 6000 |
| 3 | 0 × 8800 | 0 × ffff8000 |

The present embodiment is a specific and exemplary illustration according to the acts shown in the above-mentioned embodiments 4 and 5, which achieve similar technical effects, and will not be repeated.

The embodiment of the disclosure further provides a data compression and storage method, which can be applied to any data block (such as the data block obtained in the above embodiment, etc.), that is, the data block can include at least two data to be compressed, and the method can include following acts.

For any of the data to be compressed, compressing and storing the data to be compressed as compressed data of a data combination; wherein the data combination includes an a significant digit unit and a remainder unit. That is, when the data to be compressed is compressed, the data to be compressed can be compressed and stored as a data combination formed by two parts, namely, a significant digit unit (part) and a remainder unit (part). Accordingly, when compressed data stored using the above data combination is decompressed, the data combination can be decompressed as a block.

In an embodiment, the significant digit part of the data to be compressed may be acquired first, and then stored in a non-fixed length format (i.e., a variable length format) for the significant digit part, so that the significant digit part can be fully retained for storage.

The remainder part of the data to be compressed can be acquired and stored based on the related technical content of the data compression method in the embodiment of the disclosure, i.e., the remainder part obtained by compressing different data to be compressed is not of fixed bit width, thus achieving a specific compression ratio while achieving the purpose of larger data compression and storing with less performance loss.

The embodiment of the disclosure further provides a data decompression method, which can be applied to the compressed data of the data combination obtained by adopting the method of any one of the embodiments of the disclosure. In the method, the above compressed data of the data combination can be decompressed as a block; in an embodiment, the corresponding significant digit part can be restored from the compressed data first, and the significant digit of the compressed data can be obtained: the remainder part of the compressed data may then be obtained using any data decompression method of the disclosure based on the significant digit; further, the decompressed data corresponding to the compressed data is obtained based on the significant digit part and the remainder part.

It should be noted that because the embodiment of the present disclosure is lossy compression, the resulting decompressed data may differ from the original compressed data to a certain extent, as long as the lost information is within an acceptable range.

FIG. 5 is a schematic diagram of a structure of a data compression apparatus provided by embodiment 7 of the present disclosure. As shown in FIG. 5, the apparatus includes an acquisition module 501, a calculation module 502, and a dynamic shift processing module 503.

The acquisition module 501 is used for acquiring a data block to be compressed;

The calculation module 502 is used for calculating the average significant digit value of each data within the data block; calculating and storing an average storage bit width occupied by the remainder part of each data within the data block to be compressed according to a preset compression ratio;

The dynamic shift processing module 503 is used for dynamically shifting the original remainder part of each data within the data block according to the average significant digit value and the average storage bit width to obtain the remainder part of each data after being compressed within the data block.

The data compression apparatus provided in this embodiment is used for performing the embodiment of the aforementioned data compression (storage) method with similar technical effects, which will not be repeated.

FIG. 6 is a schematic diagram of a structure of a data decompression apparatus provided by embodiment 8 of the present disclosure. As shown in FIG. 6, the apparatus includes an acquisition module 601, a calculation module 602, and a dynamic shift processing module 603.

The acquisition module 601 is used for acquiring data to be decompressed, the data includes the significant digit corresponding to each data within the data block stored in the compression process, the average storage bit width occupied by the remainder part of each data within the data block, and the remainder part of each data after being compressed within the data block.

The calculation module 602 is used for calculating the average significant digit value of the data in the data block according to the significant digit corresponding to each data within the data block.

The dynamic shift processing module 603 is used for dynamically shifting the remainder part of each data after being compressed in the data block according to the average significant digit value and the average storage bit width to obtain the original remainder part of each data within the data block.

The data decompression apparatus provided in this embodiment is used for performing the embodiment of the aforementioned data decompression method with similar technical effects, which will not be repeated.

Figure 7:
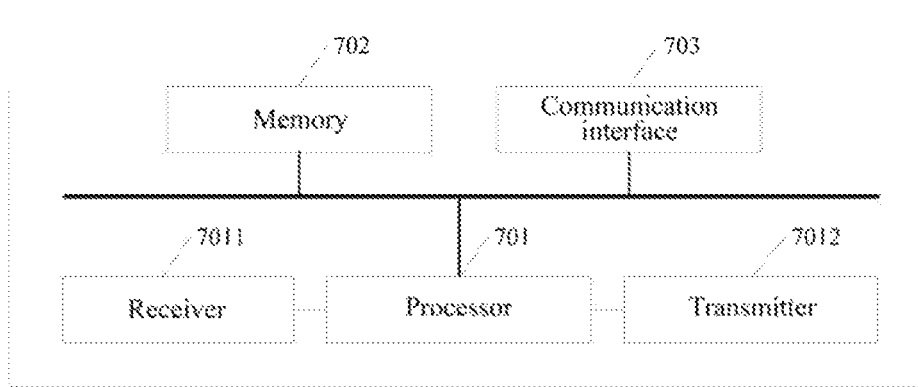
FIG. 7 is a schematic diagram of a structure of a data compression device provided by embodiment 9 of the present disclosure.

FIG. 7 is a schematic diagram of a structure of a data compression device provided by embodiment 9 of the present disclosure. The data compression device may be, for example, the above-mentioned computer, etc. As shown in FIG. 7, the electronic device may include a receiver 7011, a transmitter 7012, at least one processor 701 and a memory 702.

The receiver 7011 and the transmitter 7012 above are both coupled to the processor 701. The processor 701 controls the receiving action of the receiver 7011 and the transmitting action of the transmitter 7012.

The memory 702 is used for storing programs. In particular, the program may include program code, which includes computer operation instructions.

The memory 702 may include a high-speed RAM memory and may further include a non-volatile memory such as at least one disk storage.

The processor 701 is operable to execute computer-executed instructions stored in the memory 702 to implement the communication method described in the aforementioned method embodiments. The processor 701 may be a central processing unit (CPU), an disclosure specific integrated circuit (ASIC), or one or more integrated circuits configured to implement embodiments of the present disclosure.

In an exemplary example, the electronic device 700 may further include a communication interface 703. In terms of specific implementation, if the communication interface 703, the memory 702 and the processor 701 are implemented independently, the communication interface 703, the memory 702 and the processor 701 may be interconnected and complete communication with each other via a bus. The bus can be an industry standard architecture (ISA) bus, a peripheral component (PCI) bus, or an extended industry standard architecture (EISA) bus. The bus can be divided into address bus, data bus, control bus, etc., but it does not imply that there is only one bus or one type of bus.

In an exemplary example, if the communication interface 703, the memory 702 and the processor 701 are integrated and implemented on a single chip, the communication interface 703, the memory 702 and the processor 701 may complete communication via an internal interface.

Figure 8:
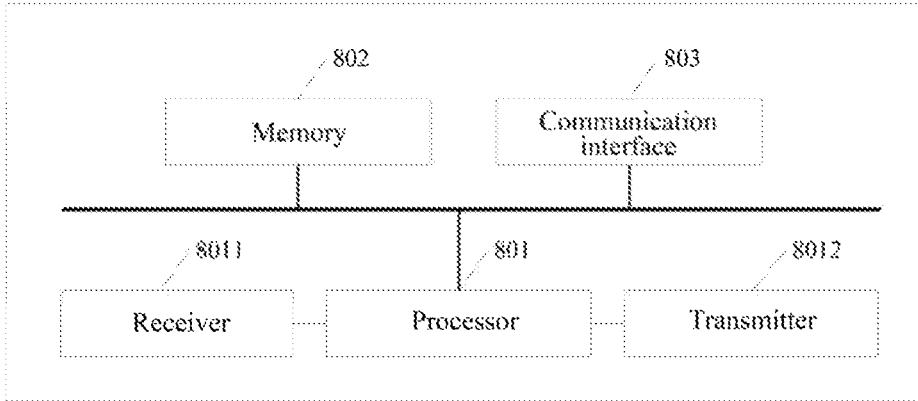
FIG. 8 is a schematic diagram of a structure of a data decompression device provided by embodiment 10 of the present disclosure.

FIG. 8 is a schematic diagram of a structure of a data decompression device provided by embodiment 10 of the present disclosure. The data decompression device may be, for example, the above-mentioned computer, etc. As shown in FIG. 8 the data decompression device may include a receiver 8011, a transmitter 8012, at least one processor 801 and a memory 802.

The receiver 8011 and transmitter 8012 above are both coupled to the processor 801. The processor 801 controls the receiving action of the receiver 8011 and the transmitting action of the transmitter 8012.

The memory 802 is used for storing programs. In particular, the program may include program code, which includes computer operation instructions.

The memory 802 may include high-speed RAM memory and may further include non-volatile memory such as at least one disk storage.

The processor 801 is operable to execute computer-executed instructions stored in the memory 802 to implement the communication method described in the aforementioned method embodiments. The processor 801 may be a central processing unit (CPU), an disclosure specific integrated circuit (ASIC), or one or more integrated circuits configured to implement embodiments of the present disclosure.

In an exemplary example, the electronic device 800 may further include a communication interface 803. In terms of specific implementation, if the communication interface 803, the memory 802 and the processor 801 are implemented independently, the communication interface 803, the memory 802 and the processor 801 may be interconnected and complete communication with each other via a bus. The bus can be an industry standard architecture (ISA) bus, a peripheral component (PCI) bus, or an extended industry standard architecture (EISA) bus. The bus can be divided into address bus, data bus, control bus, etc., but it does not imply that there is only one bus or one type of bus.

In an exemplary example, if the communication interface 803, the memory 802 and the processor 801 are integrated and implemented on a single chip, the communication interface 803, the memory 802 and the processor 801 may complete communication via an internal interface.

The invention further provides a computer-readable storage medium, which can include a U disk, a mobile hard disk, a read-only memory (ROM), a random access memory (RAM), a magnetic disk or an optical disk and other media capable of storing program codes. In particular, the computer-readable storage medium stores program instructions, which are used for the data compression or data decompression method in the above embodiments.

The disclosure further provides a program product including execution instructions stored in a readable storage medium. At least one processor of the electronic device can read the execution instruction from the readable storage medium, and the execution of the execution instruction by the at least one processor causes the electronic device to implement the data compression or data decompression method provided by the various embodiments described above.

Figure 9:
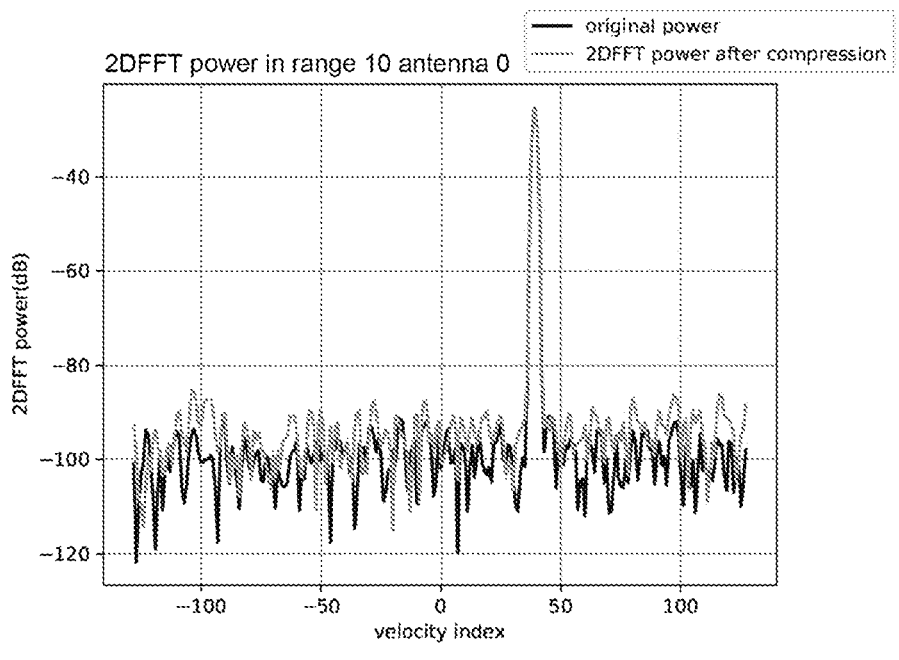
FIG. 9 is a comparison diagram of velocity dimensions obtained after processing Frequency Modulated Continuous Wave (FMCW) radar data using the compression method in an embodiment of the present disclosure.
Figure 10:
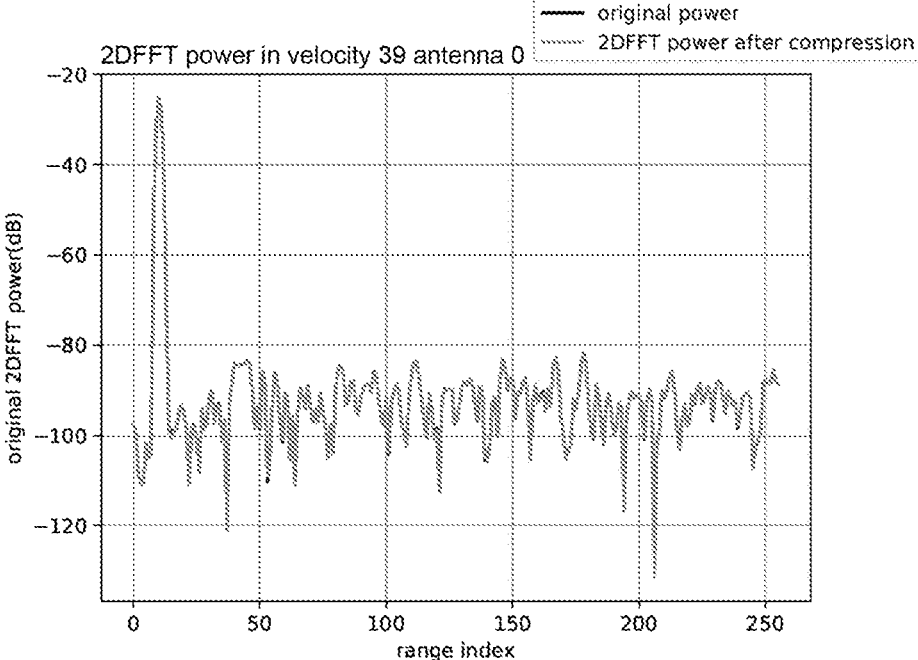
FIG. 10 is a comparison diagram of velocity dimensions obtained after processing FMCW radar data using the compression method in an embodiment of the present disclosure.

FIG. 9 is a comparison diagram of velocity dimensions obtained after processing FMCW radar data using the compression method in an embodiment of the present disclosure; FIG. 10 is a comparison diagram of velocity dimensions obtained after processing FMCW radar data using the data compression method in an embodiment of the present disclosure. Referring to FIGS. 9 and 10, by comparing the velocity dimension data between before being compressed and after being compressed, which is obtained after processing FMCW radar data with the data compression method in the embodiment of the present disclosure, it can be seen that the embodiment of the present disclosure can achieve a data storage result close to the desired by using fewer storage units (see FIG. 9), while the signal ratio changes little before and after being compressed (see FIG. 10), i.e., the signal data is well retained with less performance loss.

It should be noted that in the embodiment of the present disclosure, the number of the data in the data block is not limited to 4, but may be 8, 16 or 32, etc.; at the same time, the type of the data to be compressed is not limited to FMCW radar data, but can be other types of data, which can achieve the same compression and decompression effect. At the same time, in order to avoid redundancy, the same or similar technical content among the embodiments of the present disclosure is not reiterated. That is, the technical content among the embodiments of the present disclosure can be combined and supported with each other if there is no contradiction, so that the technical details in each embodiment can be fully understood when read by those skilled in the art.

Other embodiments of the present disclosure will readily occur to those skilled in the art after considering the specification and practicing the invention disclosed herein. The present disclosure is intended to cover any variations, uses, or adaptations of the present disclosure that follow the general principles of the present disclosure and include common sense or conventional techniques in the art that are not disclosed herein. The specification and embodiments are to be considered exemplary only, and the true scope and spirit of the present disclosure are indicated by the following claims.

It should be understood that the present disclosure is not limited to the precise structure already described above and shown in the drawings, and various modifications and changes may be made without departing from its scope. The scope of the present disclosure is limited only by the appended claims.

The invention claimed is:

1. A data compression method, applied to lossy compression, comprising:
   acquiring a data block to be compressed;
   calculating an average significant digit value of each data within the data block;
   calculating and storing an average storage bit width occupied by a remainder part of each data within the data block to be compressed according to a preset compression ratio; and
   dynamically shifting an original remainder part of each data within the data block according to the average significant digit value and the average storage bit width to obtain the remainder part of each data after being compressed within the data block.

2. The data compression method according to claim 1, wherein acquiring the data block to be compressed comprises:
   acquiring data to be compressed;
   chunking the data to be compressed to acquire a plurality of data blocks to be compressed; and
   for any data block to be compressed, determining and storing a significant digit corresponding to each data within the data block to be compressed.

3. The data compression method according to claim 2, wherein dynamically shifting the original remainder part of each data within the data block comprises:
   performing parallel processing on each data block obtained by the chunking, to dynamically shift the original remainder part of each data in each data block, respectively.

4. The data compression method according to claim 2, wherein dynamically shifting the original remainder part of each data within the data block according to the average significant digit value and the average storage bit width to obtain the remainder part of each data after being compressed within the data block comprises:
   calculating a dynamic shift bit width of the original remainder part of each data within the data block according to the average significant digit value and the average storage bit width;
   calculating a dynamic truncation bit width of the original remainder part of each data within the data block according to the significant digit, the average significant digit value and the average storage bit width corresponding to each data within the data block; and
   shifting the original remainder part of each data within the data block by a corresponding dynamic shift bit width, and taking a corresponding dynamic truncation bit width for the highest bits to obtain the remainder part of each data after being compressed within the data block.

5. The data compression method according to claim 4, wherein shifting the original remainder part of each data within the data block by the corresponding dynamic shift bit width, and taking the corresponding dynamic truncation bit width for the highest bits to obtain the remainder part of each data after being compressed within the data block comprises:
   obtaining the remainder part of each data after being compressed within the data block using the following formula:

$$M_n[i] = sat\_shift(D[i], avg\_E - db, db + E[i] - avg\_E + 1)$$

wherein $M_n[i]$ is the remainder part of the i-th data after being compressed in the data block; $D[i]$ is the original remainder part of the i-th data in the data block; avg E−db is the dynamic shift bit width of the original remainder part of the i-th data within the data block; avg_E is the average significant digit value; db is the average storage bit width; db+E[i]−avg_E+1 is the dynamic truncation bit width of the original remainder part of each data within the data block; and E [i] is the significant digit corresponding to the i-th data in the data block.

6. The data compression method according to claim 5, wherein the calculated dynamic shift bit width is less than 0, and the original remainder part of each data within the data block is shifted by the dynamic shift bit width to the left; or the calculated dynamic shift bit width is greater than 0, and the original remainder part of each data within the data block is shifted by the dynamic shift bit width to the right.

7. The data compression method according to claim 2, wherein determining and storing the significant digit corresponding to each data within the data block to be compressed comprises:

each data within the data block is a real number, and the significant digit of each data within the data block determined and stored is the significant digit corresponding to the real number; or each data within the data block is a complex number, and the significant digit of each data within the data block determined and stored is a largest one of the significant digits of both a real part and an imaginary part of the complex number.

8. The data compression method according to claim 1, wherein calculating and storing the average storage bit width occupied by the remainder part of each data within the data block to be compressed according to a preset compression ratio comprises:

acquiring a storage bit width occupied by each data when uncompressed in the data block and a storage bit width occupied by a significant digit part of each data in the data block; and multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

9. A data compression device, comprising: at least one processor, a memory, a receiver, and a transmitter, wherein:

the receiver and the transmitter are both coupled to the at least one processor; the at least one processor controls a receiving action of the receiver, and the at least one processor controls a transmitting action of the transmitter;

the memory stores computer-executable instructions; and the at least one processor executes the computer-executable instructions stored in the memory to enable the data compression device to perform the method of claim 1.

10. A data decompression method, comprising:

acquiring data to be decompressed, the data comprising a significant digit corresponding to each data within a data block stored in a compression process applied to lossy compression, an average storage bit width occupied by a remainder part of each data within the data block, and the remainder part of each data after being compressed within the data block;

calculating an average significant digit value of the data in the data block according to the significant digit corresponding to each data within the data block; and dynamically shifting the remainder part of each data after being compressed in the data block according to the average significant digit value and the average storage bit width to obtain an original remainder part of each data within the data block.

11. The data decompression method according to claim 10, wherein dynamically shifting the remainder part of each data after being compressed in the data block according to the average significant digit value and the average storage bit width to obtain the original remainder part of each data within the data block comprises:

calculating a dynamic shift bit width of the remainder part of each data after being compressed within the data block according to the average significant digit value and the average storage bit width; and shifting the remainder part of each data after being compressed within the data block by a corresponding dynamic shift bit width to obtain the original remainder part of each data within the data block.

12. The data decompression method according to claim 11, wherein shifting the remainder part of each data after being compressed within the data block by the corresponding dynamic shift bit width to obtain the original remainder part of each data within the data block comprises:

obtaining the original remainder part of each data within the data block using the following formula:

$$D_{[i]}'=\text{shift}(Mn[i],db\text{-avg\_}E)$$

wherein $D_{[i]}'$ is the original remainder part of the i-th data in the data block; $M_n[i]$ is the remainder part of the i-th data after being compressed in the data block; db-avg_E is the dynamic shift bit width of the remainder part of the i-th data after being compressed in the data block, and avg_E is the average significant digit value; and db is the average storage bit width.

13. The data decompression method according to claim 12, wherein the calculated dynamic shift bit width is less than 0, and the remainder part of each data after being compressed in the data block is shifted by the dynamic shift bit width to the left; or the calculated dynamic shift bit width is greater than 0, and the remainder part of each data after being compressed within the data block is shifted by the dynamic shift bit width to the right.

14. The data decompression method according to claim 10, wherein:

the data to be decompressed further comprises a storage bit width occupied by each data when uncompressed in the data block stored in the compression process and a storage bit width occupied by a significant digit part of each data in the data block; and the average storage bit width occupied by the remainder part of each data within the data block is calculated according to a preset compression ratio, comprising:

multiplying the storage bit width occupied by each data when uncompressed in the data block with the preset compression ratio, and subtracting the storage bit width occupied by the significant digit part of each data in the data block to obtain the average storage bit width occupied by the remainder part of each data in the data block.

15. The data decompression method according to claim 10, wherein the significant digit corresponding to each data within the data block comprises:

each data within the data block is a real number, and the significant digit of each data within the data block is the significant digit corresponding to the real number; or each data within the data block is a complex number, and the significant digit of each data within the data block is the largest one of significant digits of both a real part and an imaginary part of the complex number.

16. A data decompression device, comprising: at least one processor, a memory, a receiver, and a transmitter, wherein:

the receiver and the transmitter are both coupled to the at least one processor; the at least one processor controls a receiving action of the receiver, and the at least one processor controls a transmitting action of the transmitter;

the memory stores computer-executable instructions;

the at least one processor executes the computer-executable instructions stored in the memory to enable the data decompression device to perform the method of claim 10.

17. A method of data compression and storage, applied to lossy compression, applied to any data block to be compressed, the data block comprising at least two data to be compressed, the method comprising:

for any of the data to be compressed, compressing and storing the data to be compressed as compressed data of a data combination, wherein the data combination comprises a significant digit unit and a remainder unit.

18. The method according to claim 17, further comprising:

acquiring a significant digit part of the data to be compressed, wherein the significant digit part is retained and stored in the significant digit unit in a variable length format.

19. The method according to claim 17, further comprising:

acquiring a remainder part of the data to be compressed using a data compression method, wherein the data compression method comprises: acquiring a data block to be compressed; calculating an average significant digit value of each data within the data block; calculating and storing an average storage bit width occupied by a remainder part of each data within the data block to be compressed according to a preset compression ratio; and dynamically shifting an original remainder part of each data within the data block according to the average significant digit value and the average storage bit width to obtain the remainder part of each data after being compressed within the data block, wherein the remainder part is stored in the remainder unit.

20. A method of data decompression, applied to the compressed data of the data combination obtained using the method according to claim 17, the method comprising:

restoring a corresponding significant digit part from the compressed data and obtaining a significant digit of the compressed data;

obtaining a remainder part of the compressed data based on the significant digit; and obtaining a decompressed data corresponding to the compressed data based on the significant digit part and the remainder part.

* * * * *